United States Patent [19]

Anderson et al.

[11] 4,000,717

[45] Jan. 4, 1977

[54] APPARATUS FOR EPITAXIAL DEPOSITION

[75] Inventors: Philip Leroy Anderson, Richardson; William Wesley Gartman, Garland, both of Tex.

[73] Assignee: Texas Instruments Incorporated, Dallas, Tex.

[22] Filed: Dec. 12, 1974

[21] Appl. No.: 531,933

[52] U.S. Cl. .................................................. 118/49
[51] Int. Cl.$^2$ ........................................ C23C 13/08
[58] Field of Search ........................... 118/48–49.5, 118/500, 503, 319; 269/57; 427/50, 51, 69, 70, 78, 91, 166, 167, 248–255

[56] References Cited

UNITED STATES PATENTS

| | | | |
|---|---|---|---|
| 3,727,620 | 4/1973 | Orr | 118/319 UX |
| 3,931,789 | 1/1976 | Kakei et al. | 118/49 |

FOREIGN PATENTS OR APPLICATIONS

| | | | |
|---|---|---|---|
| 1,032,998 | 6/1958 | Germany | 118/49 |

Primary Examiner—Morris Kaplan
Attorney, Agent, or Firm—Harold Levine; James T. Comfort; Gary C. Honeycutt

[57] ABSTRACT

The disclosure relates to apparatus for the deposition of epitaxial (semiconductor) layers by the vapor phase epitaxial growth technique wherein the carrousel for carrying substrate (semiconductor) slices onto which epitaxial deposition is to take place is arranged whereby, in accordance with the first embodiment, the slices are placed in compartments in the carrousel, the gases passing over the substrates in each of the compartments without then passing onto other compartments to prevent contamination between substrates and from the effluent gases provided after deposition on one of the substrates. This provides a decrease in cross-contamination and an increase in the packing density of substrates onto which epitaxial deposition is to take place.

In accordance with the second embodiment of the disclosure, a cellular-structured carrousel is provided, the circumferential side of the radially formed compartments being opened, thereby providing a minimal amount of gas phase cross-contamination between compartments.

12 Claims, 5 Drawing Figures

APPARATUS FOR EPITAXIAL DEPOSITION

This invention relates to the deposition of epitaxial layers and, more particularly, to an improved apparatus for depositing epitaxial layers by the vapor phase epitaxial growth technique wherein the preparation of the epitaxial layer is accomplished by chemical vapor deposition or by physical vapor deposition.

The prior art production systems and processes for preparing epitaxial layers by chemical or physical vapor deposition suffer several disadvantages. These disadvantages include relatively low output volume per run of the equipment which presently is limited by the low packing density of substrate surface area per unit reactor volume. In addition, production uniformity is limited by the use of multiple rows of substrates in many examples of the prior art operation. The problem encountered is caused by temperature nonuniformity which is not readily modified with the prior art equipment. Furthermore, with regard to production quality, detrimental impurities may be incorporated in the epitaxial layer during deposition due to the unrestricted gas phase flow patterns which permits the migration of impurity species among the multiple substrates. The prior art process permits the cross-contamination of products by the transport of gas phase impurities from upstream substrates to downstream substrates, or among adjacent substrates.

In accordance with the present invention, the above-mentioned problems of the prior art are overcome by providing an apparatus which, when used in commercially available reactors, can significantly increase capacity, isolate substrates and minimize the requirements for temperature uniformity over extended volumes. Briefly, the above is accomplished by arranging the substrates on vein-like blades which are arranged radially about a center support hub. Advantageously, these blades direct the gas flow across each substrate in a manner to inhibit back-diffusion and auto-doping from substrate to substrate. Each substrate is located in its own separate compartment. In some cases, this compartmentalization may be enhanced by enclosing the circumference of a support blade with an additional plate. Since epitaxial growth is from essentially a "segment" of the total gas flow through the reactor, epitaxial thickness and thickness uniformity is primarily a function of plate geometry and gas flow rates. The size and shape of each individual substrate is no longer a first order function in determining epitaxial layer thickness.

It is therefore an object of this invention to provide an apparatus for epitaxial deposition which increases the volume of epitaxially deposited layers per run of the equipment.

It is further object of this invention to provide an apparatus for epitaxial which provides greater product uniformity than prior art epitaxial deposition systems.

It is yet a further object of this invention to provide an apparatus for epitaxial deposition which substantially eliminates cross-contamination of product by the transport of contaminants from upstream slices to downstream slices.

The above objects and still further objects of this invention will immediately become apparent to those skilled in the art after consideration of the following preferred embodiments thereof, which are provided by way of example and not by way of limitation, wherein.

Figure 1:
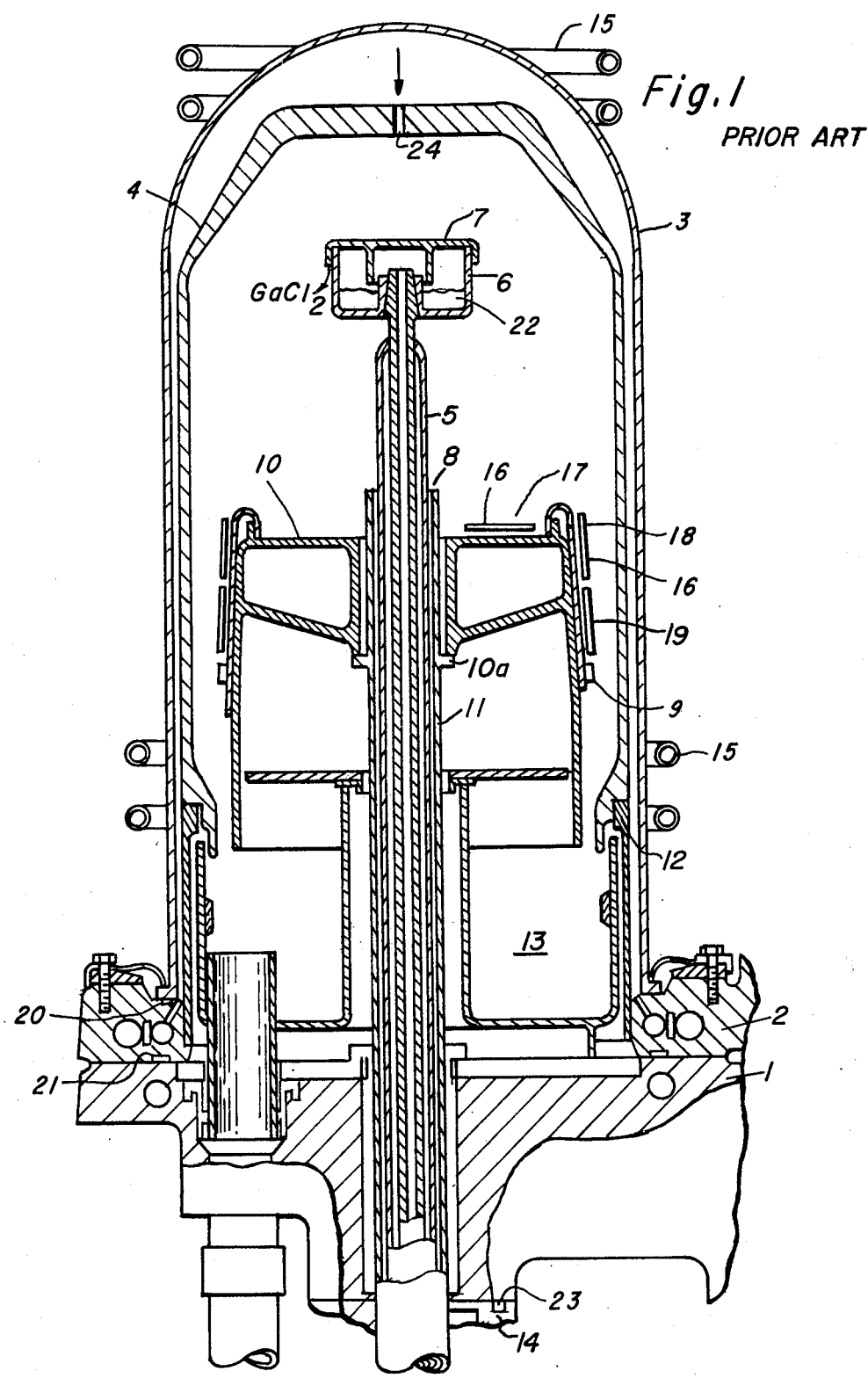
FIG. 1 is a cross sectional view of a reactor for epitaxial deposition in accordance with the prior art.

Referring to FIG. 1, there is shown a cross section of a prior art reactor with a reactor chamber therein. The reactor includes a quartz bell jar 3 and a graphite dome 4 which is a susceptor and around which an r.f. heater 15 is loaded. The reactor includes a mechanism 2 for raising and lowering the bell jar. Within the dome is a reaction chamber and within the reaction chamber is a carrousel 10 with slice holders 9 thereon. The slices 16 hang vertically on the holder line and on top of the carrousel. The slices 16 having an inside row position 17, a top row position 18 and a bottom row position 19. There is a restriction in capacity by the diameter of the cylinder of the carrousel which will determine the number of slices that can be placed into the reactor. The carrousel rotates around on the member 11 during operation.

In greater detail, the reactor includes a base plate assembly 1 and a lift plate assembly 2 which seals the bell jar at all the workings and raises and lowers the bell jar when slices are to be loaded and unloaded into the reactor. There are two O-ring seals 20 and 21 to seal the chamber and provide gas integrity. The graphite susceptor 4 is not sealed. Rather, it rests in a groove and is, by design, somewhat sealed but not completely gas tight. The quartz bell jar 3 fits over the outside of the entire system. The element 5 is a coaxial tube. All of the gases are delivered into the system through the maze of tubing within the coaxial tube 5, the outside wall of which carries the arsine, phosphine and some hydrogen. The inside tube of the coaxial tube 5 carries HCl gas plus hydrogen which is used to transport the gallium which rests in a dish 6 at the top of the tube 5. The dish 6 which contains the gallium is a quartz dish and gallium melt rests in he base of this dish as shown by 22. The HCl gas reacts with the gallium in the dish 6 to provide gaseous gallium chloride at temperatures being operated at. This gas goes off as gallium chloride gas as shown by the arrow emanating from dish 6. A lid 7 is provided over the dish 6 to help direct the flow of gallium chloride out of the sides of the dish 6 as well as to prevent the return of gases back into the gallium melt 22.

The rotation rod 11 is the outside sleeve of the inner portion of the reactor chamber and is coupled through the magnetic interlocks at the base of the assembly to allow rotation of the slice carrier of carrousel 10. The slice carrier 10 includes a plurality of slice carrier hangers 9 which hang on the carrousel in the form of a hook. The carrousel 10 is a large cylinder as shown in the figure. A ring 10a in the form of a flange supports the carrousel 10 and prevents it from dropping lower along the rotation rod 11: Therefore, the carrousel 10 rests on the ring 10a. An orifice 8 is provided for hydrogen flow. The hydrogen flow is a counterflow to keep the region free from clogging up due to deposits. The element 12 is a susceptor support and is an additional piece of graphite which supports the graphite susceptor 4. A pretrap 13 is provided and is essentially an assembly for collection of solid waste from the reaction chamber and products of the reaction which may deposit and may be collected therein. The rotation mechanism 14 includes an O-ring seal 23 and provides for rotation of the courrousel and associated assembly. The assembly includes a pneumatic or mechanical life (not shown) for lifting the elements 3, 4 and 2 so that it is possible to get to the inside of the chamber for depositing slices therein. The chamber 4 can be quartz or any other suitable material such as silicon carbide, etc. which is chemically compatible with the reaction and can stand the temperatures of the reaction. In operation, first the chamber is opened up through a pneumatic lift mechanism 2 and slices 16 are placed onto the plates 9 and 10 as shown. The assembly is closed up and by programming of flows and temperature cycles, first the optimum temperature is achieved which is in the neighborhood of 800° C or between 750°–850° C in the deposition region and about 900° C in the gallium generation zone. A temperature profile is provided by the RF coils 15 by having variable spacing of the coils, the amount of RF heating being determined by the coil spacing. In this way, temperature gradients can be provided in the desired manner within the chamber by judicious spacing of coils in various ways along the length of the chamber. The coil is a single coil which travels the entire length of the chamber. As the spacing is widened there is less coupling into the graphite and therefore a lower temperature. The arrow at the top of the susceptor points to an orifice 24 for introducing an additional hydrogen flow which comes from outside of the graphite susceptor between jar 3 and dome 4 and enters the deposition zone through the orifice. This is to prevent deposition from occurring on the outside of the wall and keeping all of the reaction products within the chamber. The gallium melt 22 combines with the HCl gas and provides a gallium chloride gas which goes into the chamber and combines with arsine and phosphine to provide gallium arsenide phosphide which is deposited on the slices 16. The slices can be made of any semiconductor material. The industry normally uses gallium arsenide as the substrate. However, other semiconductor substrate materials can be used. The substrate can be germanium, silicon, or other appropriate substrates as well as gallium arsenide. The carrousel 10 is rotated on the member 11 which rotates and carries the carrousel 10 during the deposition. This is the prior art system which causes problems as enumerated above.

The first problem is packing density, the only prior known method of improving this is to increase the circumference of the reaction chamber and carrousel. The second problem is that the substrate can evolve a gaseous dopant. If the single substrate is exposed, the entire slice is not covered with the deposit and the reaction HCl gas and the substrate will provide a dopant gas which will migrate around the entire reactor system and contaminate the balance of the slices within the chamber, subsequently causing loss of the deposition load.

Figure 2:
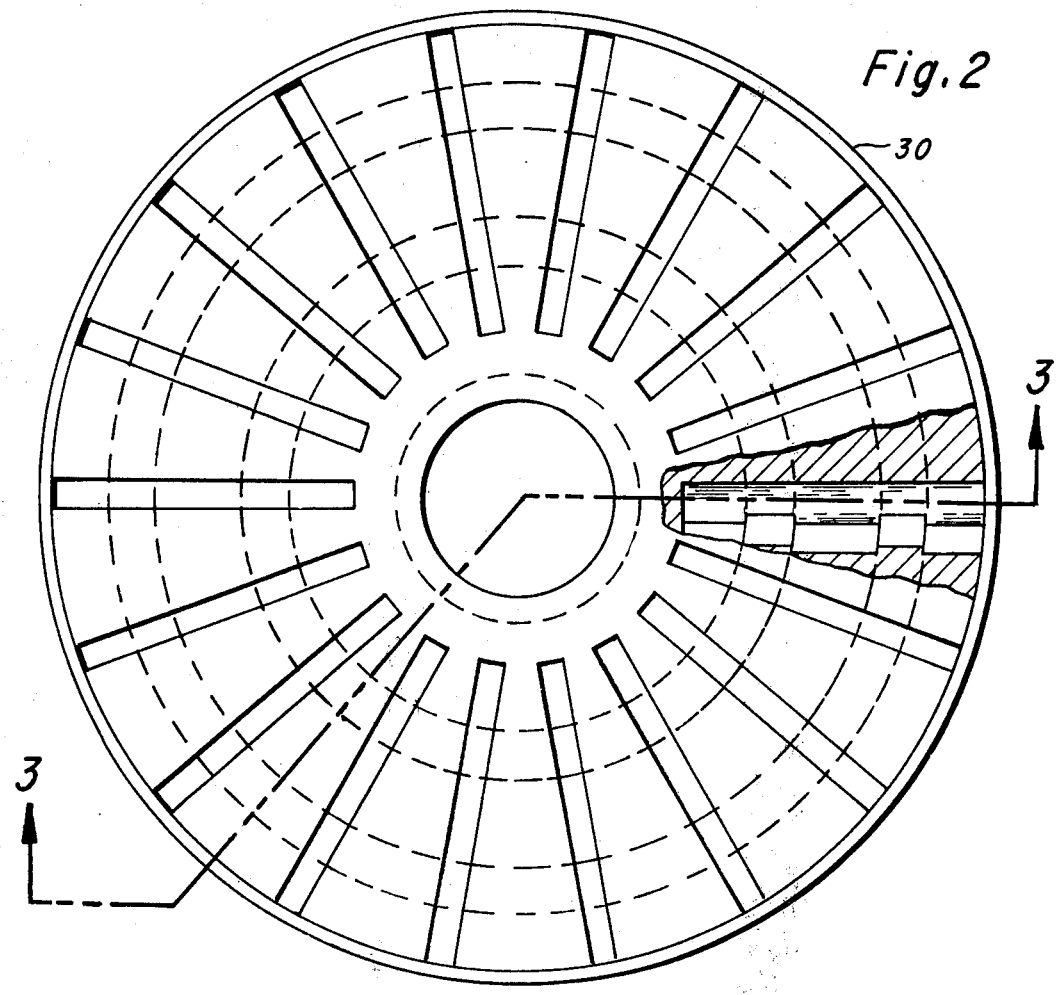
FIG. 2 is a top view of a carrousel for use in the reactor of FIG. 1 in accordance with the present invention.
Figure 3:
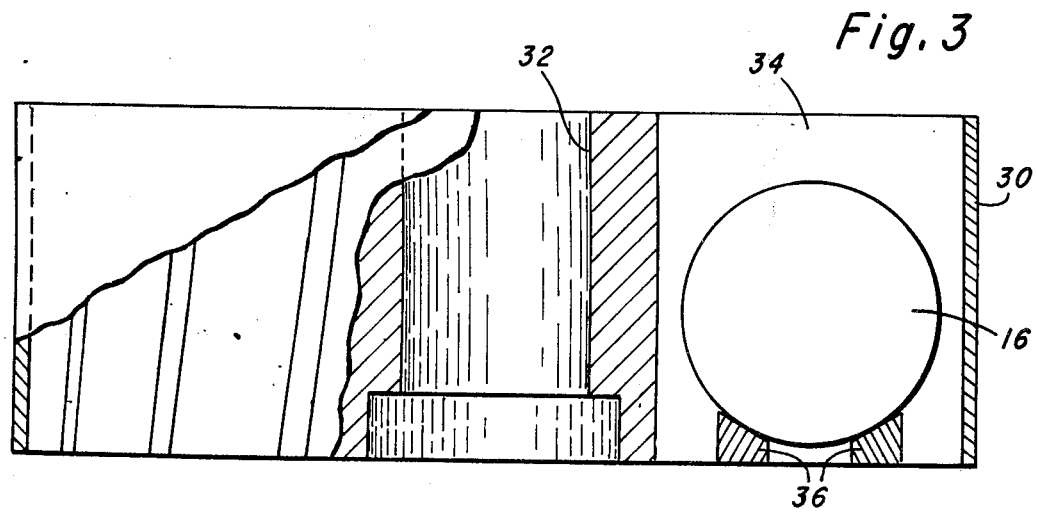
FIG. 3 is a view taken along the lines 3—3 of FIG. 2.

Referring now to FIGS. 2 and 3, there is shown a first embodiment of a carrousel in accordance with the present invention. The carrousel is in the form of a cylinder having an outer circumferential wall 30, and inner hollow cylindrical portion 32 and radial wall members 34. The carrousel of FIGS. 2 and 3 would replace the carrousel 10 of FIG. 1 of the prior art. The member 32 will rest on the flanges 10a at their lowermost region to prevent downward movement of the carrousel of FIGS. 2 and 3 below said point of the flange 10a. The slices 16 will sit on slats 36 on the floor of the carrousel, the slices 16 resting thereon and against a wall 34 at a slight angle from the vertical. The carrousel of FIGS. 2 and 3 will be open at the top and bottom but not at the side so that the gases formed in the chamber will pass therethrough from top to bottom and prevent any contamination of the slices by movement of gas from slice to slice. The carrousel of FIGS. 2 and 3 can be made of the same materials as the carrousels of the prior art. The requirements would be that the carrousel material not include any material which can act as a contaminant in the reactions being performed and which can withstand the temperatures within the reaction chamber without deforming or causing any other problems.

Figure 4:
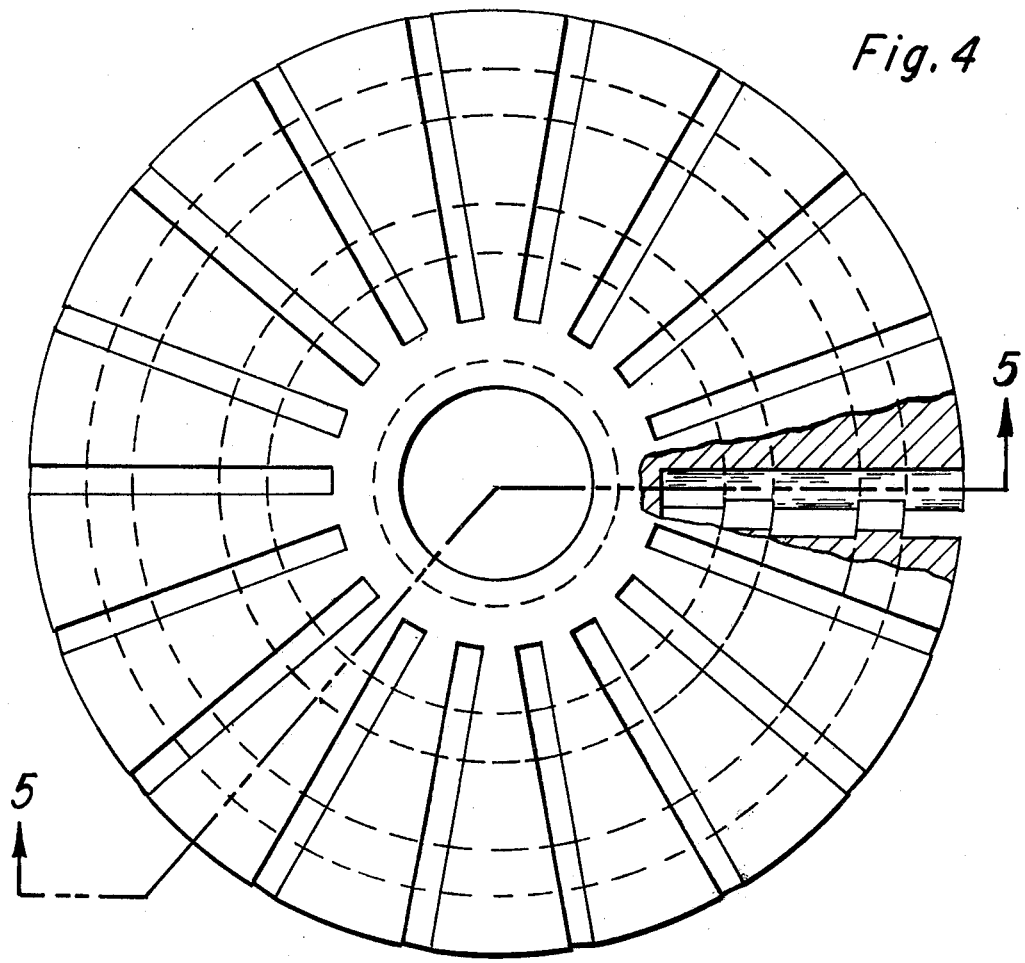
FIG. 4 is a top view of a second embodiment of a carrousel in accordance with the present invention.
Figure 5:
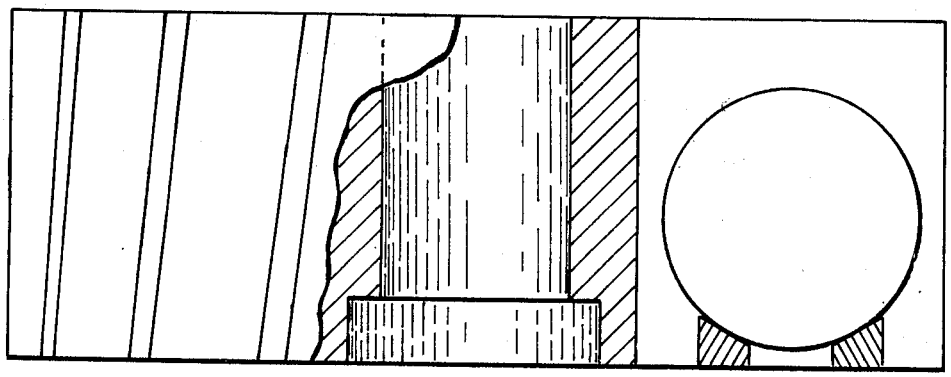
FIG. 5 is a view taken along the line 5—5 of FIG. 4.

Referring now to FIGS. 4 and 5, there is shown a carrousel identical to that of FIGS. 2 and 3, except that the outer wall 30 of FIGS. 2 and 3 has been removed. This embodiment will allow for slightly additional cross-contamination, though the cross-contamination will be minimal since the gases will be moving primarily from top to bottom through the carrousal without being able to move backward and contaminate other slices.

If desired, the number of slices positioned against each radial wall 34 of the carrousel can be increased and be greater than the one as shown in FIGS. 2 through 5. This will increase the loading capacity and the loading density of the carrousel.

The concept developed essentially isolates each slice from the other slices, this being an isolation concept or cellular structure to prevent migration of gas phase species and results in much lower losses from a yield standpoint. The slices fit into the chamber between quartz plates and the gas enters from the top of the holder and goes out through the bottom. There is therefore no migration of gases from one wafer to the next. A single substrate is placed in each compartment so that gas flow is through each compartment from top to bottom. Thus, a segment of the gas will see only a single substrate and then be flushed out and never see any other substrate, so there is substantially no cross-contamination from substrate to substrate. In addition, there is a practical advantage in that because the temperature gradients and control of the temperature gradients is an important parameter in the growth of useful material, there is a need to control temperature gradient only for a single row of substrates; whereas, in the prior art practice, temperature has to be controlled over three rows of substrate simultaneously. The amount of area of wafer that can be used on a run is not diminished because of the increase in packing density due to the radial spoke arrangement. Actually, the packing density becomes even greater with the radial spoke arrangement because the full internal diameter of the reaction system is used. The slices are sitting in the compartments at a slight angle to the vertical.

If desired, there can be several slices within each compartment or several rows up and down, as desired; however, it is necessary that the effluent from one compartment does not go into a lower row of compartments in order to have the extra advantage of non-cross-contamination of effluent gases. There would also be some cross-contamination within a single chamber.

In a laboratory system, the prior art operating capacity of the reactor was 50 – 75 square inches and with the present invention the capacity was 100 square inches. With slight modification of the equipment, it is possible to increase the capacity to about 200 square per run. Silicon with a silicon epitaxial layer of any other type of epitaxial deposition in addition to Group III–V discussed above can be used. In other words, anything that can be epitaxially deposited by chemical vapor deposition or by physical vapor deposition can be used in the present embodiment. This includes, but is not limited to, silicon, germanium, Group III–V and alloys, Group II–VI and oxide and nitride coatings used in semiconductor processing.

Though the invention has been described with respect to specific preferred embodiments thereof, many variations and modifications will immediately become apparent to those skilled in the art. For example, the reactor and carrousel axis can be horizontal, with horizontal gas flow. Such an embodiment would require slight modification of the slice holders to provide more positive retention of slices during rotation. It is, therefore, the intention that the appended claims be interpreted as broadly as possible in view of the prior art to include all such variations and modifications.

WHAT IS CLAIMED IS:

1. Apparatus for epitaxial deposition wherein the epitaxial layer is prepared by chemical vapor deposition or by physcial vapor deposition which comprises:
   a. a vertical reaction chember;
   b. carrousel horizontally disposed in said reaction chamber;
   c. means to pass gases through said carrousel; and
   d. said carrousel comprising a central region, a plurality of walls extending radially outward from said central region said walls being slightly inclined from the vertical for positioning each slice at a slight angle with respect to the direction of gas flow, and means to support slices between a pair of adjacent walls.

2. Apparatus for epitaxial deposition as set forth in claim 1 further comprising means for rotating said carrousel within said chamber.

3. Apparatus for epitaxial deposition as set forth in claim 1 further including a cylindrically shaped wall abutting the outer edges of said radial walls, whereby partially enclosed compartments are provided.

4. Apparatus for epitaxial deposition as set forth in claim 2 further including a cylindrically shaped wall abutting the outer edges of said radial walls.

5. Apparatus as in claim 1 wherein said means to pass gases through the carrousel directs the gases along a path parallel to the carrousel axis.

6. Apparatus as in claim 5 wherein said axis is vertical.

7. Apparatus for epitaxial deposition as set forth in claim 1 wherein said carrousel supports one vertical level of slices only; a single slice being located between each adjacent pair of radial walls.

8. Apparatus for epitaxial deposition as set forth in claim 2 wherein said carrousel supports only one vertical level of slices, and only one slice is located between each adjacent pair of radial walls.

9. Apparatus for epitaxial deposition as set forth in claim 3 wherein said carrousel supports only one vertical level of slices, and only one slice is located between each adjacent pair of radial walls.

10. Apparatus for epitaxial depositions as set forth in claim 4 wherein said carrousel supports only one vertical level of slices, and only one slice is located between each adjacent pair of radial walls.

11. Apparatus for epitaxial deposition as set forth in claim 5 wherein said carrousel supports only one vertical level of slices, and only one slice is located between each adjacent pair of radial walls.

12. Apparatus for epitaxial deposition as set forth in claim 6 wherein said carrousel supports only one vertical level of slices, and only one slice is located between each adjacent pair of radial walls.